United States Patent [19]

Takei et al.

[11] Patent Number: 5,129,359
[45] Date of Patent: Jul. 14, 1992

[54] MICROWAVE PLASMA CVD APPARATUS FOR THE FORMATION OF FUNCTIONAL DEPOSITED FILM WITH DISCHARGE SPACE PROVIDED WITH GAS FEED DEVICE CAPABLE OF APPLYING BIAS VOLTAGE BETWEEN THE GAS FEED DEVICE AND SUBSTRATE

[75] Inventors: Tetsuya Takei, Nagahama; Hiroyuki Katagiri, Shiga; Toshiyasu Shirasuna, Nagahama, all of Japan

[73] Assignee: Canon Kabushiki Kaisha, Tokyo, Japan

[21] Appl. No.: 549,243

[22] Filed: Jul. 9, 1990

Related U.S. Application Data

[63] Continuation of Ser. No. 435,180, Nov. 13, 1989, abandoned.

[30] Foreign Application Priority Data

Nov. 15, 1988 [JP] Japan .................. 63-286734
Oct. 16, 1989 [JP] Japan .................. 1-266308

[51] Int. Cl.$^5$ .................................. C23C 16/50
[52] U.S. Cl. ........................ 118/723; 118/730; 427/39; 427/45.1
[58] Field of Search ............. 118/715, 723, 730; 156/345, 643; 427/38, 39, 45.1

[56] References Cited

U.S. PATENT DOCUMENTS

| | | | |
|---|---|---|---|
| 4,840,139 | 6/1989 | Takei | 118/50.1 |
| 4,897,281 | 1/1990 | Arai et al. | 427/8 |
| 4,897,284 | 1/1990 | Arai et al. | 427/39 |
| 4,953,498 | 9/1990 | Hashizume et al. | 118/719 |

FOREIGN PATENT DOCUMENTS

| | | | |
|---|---|---|---|
| 57-167631 | 10/1982 | Japan | 118/723 |
| 59-78528 | 5/1984 | Japan . | |
| 61-143579 | 7/1986 | Japan | 118/723 |
| 61-283116 | 12/1986 | Japan . | |
| 62-44577 | 2/1987 | Japan | 118/723 |
| 63-50479 | 3/1988 | Japan | 118/723 |
| 63-282271 | 11/1988 | Japan | 118/723 |
| 64-56873 | 3/1989 | Japan | 118/723 |

*Primary Examiner*—Shrive Beck
*Assistant Examiner*—Terry J. Owens
*Attorney, Agent, or Firm*—Fitzpatrick, Cella, Harper & Scinto

[57] ABSTRACT

A microwave plasma CVD apparatus for the formation of a functional deposited film includes a gas supply pipe to which a bias voltage is applied so as to form an electric field between the gas supply pipe and a substrate onto which the film is deposited.

20 Claims, 15 Drawing Sheets

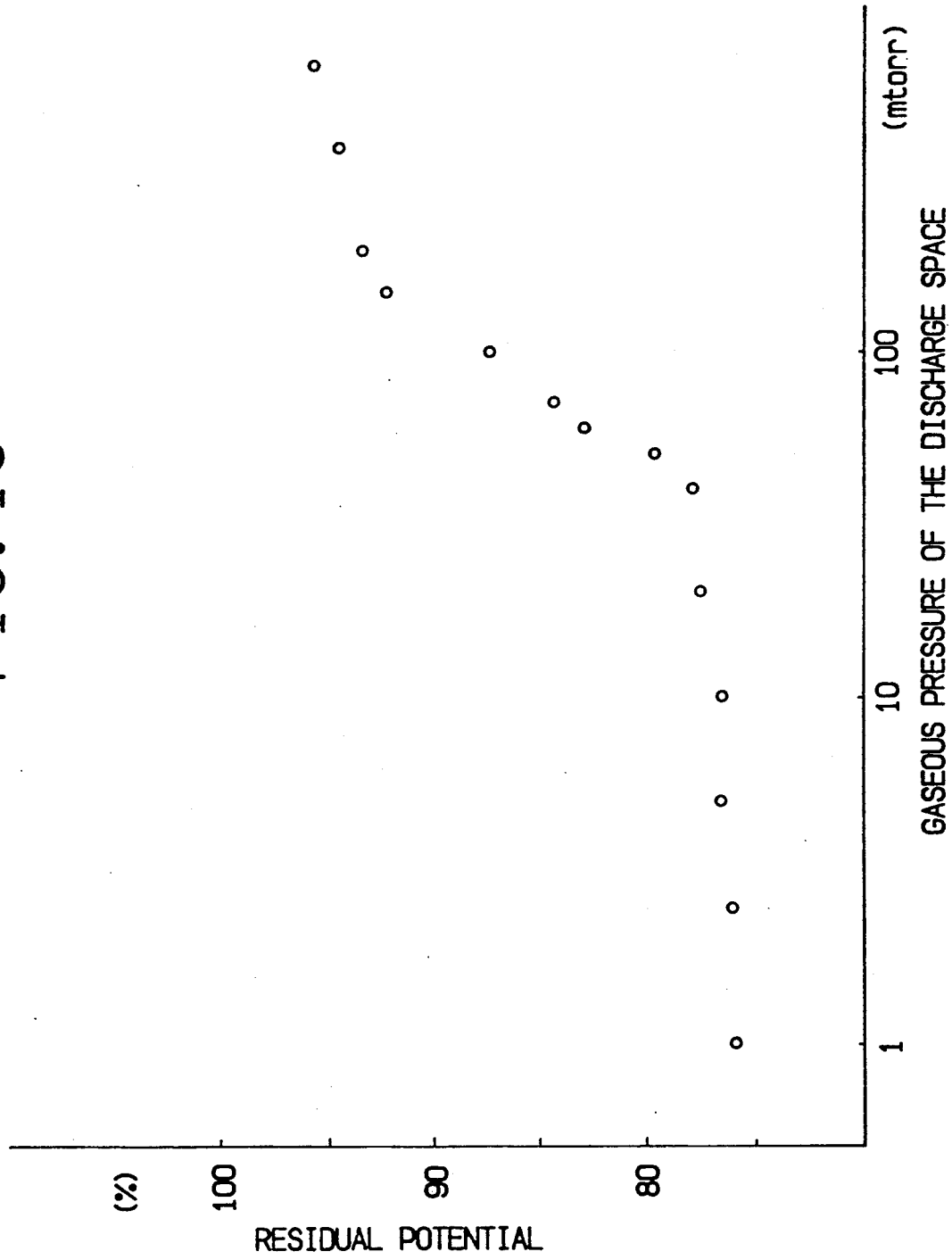

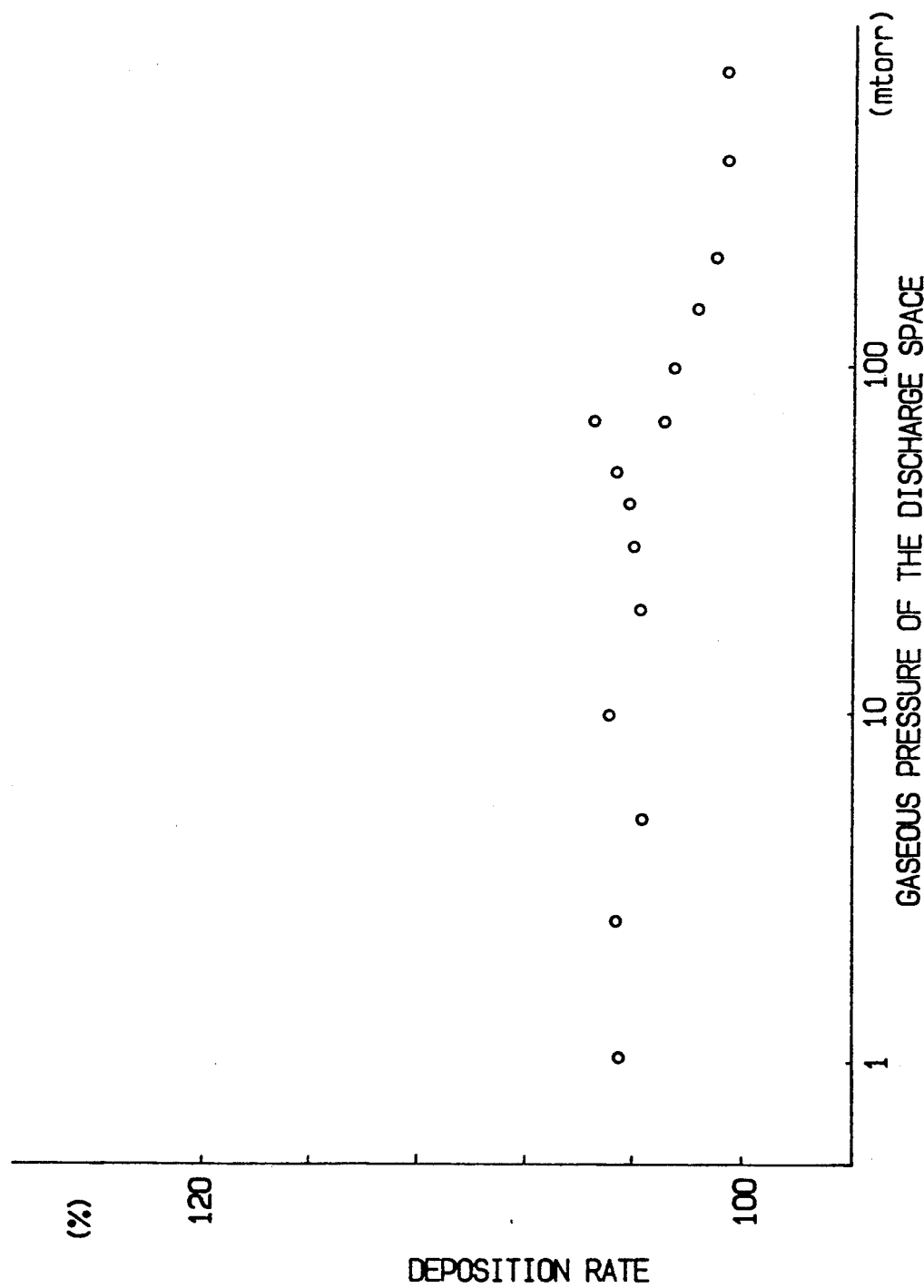

MICROWAVE PLASMA CVD APPARATUS FOR THE FORMATION OF FUNCTIONAL DEPOSITED FILM WITH DISCHARGE SPACE PROVIDED WITH GAS FEED DEVICE CAPABLE OF APPLYING BIAS VOLTAGE BETWEEN THE GAS FEED DEVICE AND SUBSTRATE

This application is a continuation of application Ser. No. 07/435,180 filed Nov. 13, 1989, now abandoned.

FIELD OF THE INVENTION

The present invention relates to an improved microwave plasma CVD apparatus for the formation of a functional non-single-crystal deposited film such as an amorphous silicon film on a substrate, which is usable especially as a photoconductive member for semiconductor devices, photosensitive devices for use in electrophotography, image input line sensors, image pickup devices, photoelectromotive force devices or the like. More particularly, the present invention relates to an improved microwave plasma CVD apparatus for the formation of said functional deposited film, which has a discharge space provided with gas feed means capable of serving also as means to apply a bias voltage between the gas feed means and a substrate on which a film is to be deposited.

BACKGROUND OF THE INVENTION

Hitherto, as the element member of semiconductor devices, photosensitive devices for use in electrophotography, image input line sensors, image pickup devices or other optical devices, there have been proposed a number of amorphous semiconductor films, for instance, an amorphous deposited film composed of an amorphous silicon material compensated with hydrogen atoms (H) or/and halogen atoms (X) such as fluorine atoms or chlorine atoms hereinafter referred to as "a-Si(H,X)"]. Some of such films have been put to practical use.

Along with those amorphous semiconductor films, there have been proposed various methods for their preparation using plasma chemical vapor deposition technique wherein a raw material is decomposed by subjecting it to the action of an energy of direct current, high frequency or microwave glow discharging to thereby form a deposited film on a substrate of glass, quartz, heat-resistant resin, stainless steel or aluminum. And there have been also proposed various apparatus for practicing such methods.

Now, in recent years, the public attention has been focused on plasma chemical vapor deposition process by means of microwave glow discharging decomposition hereinafter expressed by the abbreviation "MW-PCVD process" also at industrial level.

A typical MW-PCVD apparatus for practicing the MW-PCVD process is disclosed in Japanese Laid-open Patent Application No. 59(1984)-078528. Japanese Laid-open Patent Application No. 61(1986)-283116 discloses an improved MW-PCVD apparatus. In the latter publication, there is described a MW-PCVD process wherein an electrode is provided in the discharge space and a desired voltage is applied during the film formation in order to control the plasma potential in the discharge space, thereby depositing a film while controlling ion impacts of deposition species. It is also described how the characteristics of the resulting deposited film are substantially improved.

Typical examples of the foregoing known MW-PCVD apparatus are shown in FIG. 4 and FIG. 5.

FIG. 4 shows a schematic constitution of the known MW-PCVD apparatus of the type wherein only one substrate is provided. FIG. 5 shows a schematic constitution of the known MW-PCVD apparatus of the type wherein a plurality of substrates are provided simultaneously.

In FIG. 4, reference numeral 401 indicates a reaction chamber having a hermetically sealed vacuum structure. The reaction chamber is provided with a microwave introducing window 402 formed of a dielectric material through which microwave power can be efficiently transmitted into the reaction chamber. The dielectric material of which the microwave introducing window is formed is, for example, quartz glass, alumina ceramics or the like. Reference numeral 403 indicates a microwave transmitting unit comprising a metallic waveguide extending through a matching box and an isolator from a microwave power source (not shown). The reaction chamber 401 is provided with an exhaust pipe 404 which is open into the reaction chamber at one end and is communicated through an exhaust valve with an exhaust device (not shown) at the other end. Reference numeral 405 indicates a substrate on which a deposited film is formed which is placed on a substrate holder 407 having an electric heater (not shown) for controlling the temperature of the substrate 405. The reaction chamber 401 is provided with a gas supply pipe 408 extending from a reservoir (not shown). Reference numeral 406 indicates a discharge space. Reference numeral 410 indicates an electrode situated in the discharge space 406 which serves to control plasma potential of the discharge space. The electrode 410 is electrically connected to a bias power source 409 such as DC power source.

The apparatus shown in FIG. 5 is similar to that of FIG. 4 except that a plurality of substrates 505 are provided along a bias electrode 510.

The film formation by these known MW-PCVD apparatus is fundamentally carried out in the following manner, for example, in the case of using the apparatus of FIG. 4.

The reaction chamber 401 is evacuated by means of a vacuum pump (not shown) to bring the inner pressure to about $1 \times 10^{-7}$ Torr. Subsequently, the heater built in the substrate holder 407 is energized to maintain the substrate 405 at a desired temperature suitable for the formation of a deposited film. When an amorphous silicon deposited film is formed, for example, a starting gas such as silane gas ($SiH_4$) is fed into the reaction container 401 through the gas supply pipe 408. At the same time, the microwave power source is turned on so that a microwave having a frequency of 500 MHz or over, preferably 2.45 GHz, is generated. This microwave is passed through the waveguide 403 and the microwave introducing window 402 into the reaction chamber 401.

Thus, the gas in the reaction chamber 401 is excited with the action of microwave energy and dissociated, thereby causing the formation of a deposited film on the surface of the substrate 405.

Any of the foregoing known MW-PCVD apparatus makes it possible to form a relatively thick photoconductive film at a high deposition rate.

With such known apparatus, however, when a large area device is made, such as an electrophotographic photosensitive member which is required to have uniform characteristics over a large area, satisfactory results are difficult to obtain in view of the characteristics and economy.

More particularly in this respect, when a starting gas is fed from the outside of the discharge space, the gas is successively decomposed and ionized when placed in plasma zone. At this time, the radical concentration and the ion concentration in the plasma zone become greatly varied at the upstream side (the inlet side of the starting gas) and at the downstream side (exhaust means side of the starting gas) of the starting gas.

This entails variations in the quantity and intensity of ion bombardment on the substrate at the upstream and at the downstream sides, thereby causing a thickness and electric characteristics of the resulting deposited film to become non-uniform.

Further, since the starting gas is passed from the outside of the discharge space into the inside of the plasma, part of the gas will not pass through the central portion of the plasma where the plasma intensity is high, and will be exhausted without being decomposed. Thus, the utilizing efficiency of the starting gas unavoidably becomes insufficient.

In addition, since the starting gas is supplied from the outside of the plasma, its ionization proceeds, in most case, at a position which is far away from the bias electrode located in the inside of the plasma. The energy of the ions is not sufficiently high relative to the substrate, resulting in unsatisfactory bombardment on the substrate. When the voltage at the bias electrode increases for the purpose of enhancing the effect of the bombardment, abnormal discharge from the bias electrode, such as sparks, takes place.

On the other hand, when the starting gas supply means is provided in the inside of plasma, it invariably passes through the center of the plasma, so that decomposition proceeds satisfactorily. However, the electric field in plasma is disturbed by the starting gas supply means and by the flow of the starting gas, with the thickness of a deposited film on the substrate and the uniformity of electric characteristics being unsatisfactory.

Especially, when a plurality of substrates are provided to surround the plasma therewith in order to increase the gas utilizing efficiency, the negative influence becomes considerable.

The above influence is problematic not only when the starting gas supply means is electrically conductive, but also when it is insulative. That is, as a film becomes deposited on the surface of the starting gas supply means, the disturbance of the electric field in plasma is turned greater.

SUMMARY OF THE INVENTION

The present invention contemplates to overcome the foregoing problems involved in the known MW-PCVD apparatus and makes it an object to provide an improved MW-PCVD apparatus suitable for forming a semiconductor member for use in semiconductor devices, photoconductive devices for use in electrophotography, image input line sensors, image pickup devices, photoelectromotive force devices, optical devices and the like, wherein the gas utilizing efficiency is improved and which is capable of stably forming a desirable semiconductor film of uniform quality at a high deposition rate.

The present inventors have made extensive studies in order to overcome the foregoing problems involved in the known MW-PCVD apparatus and in order to attain the above object. As a result, the present inventors have found the facts that when a starting gas supply means is provided in the discharge space and the starting gas supply means is provided with means for applying a bias voltage so as to provide an electric field between the starting gas supply means and the substrate, the foregoing problems involved in the known MW-PCVD apparatus can be effectively eliminated and a desirable deposited film of high quality can be effectively and stably formed on the substrate at an improved deposition rate and with an improved gas utilizing efficiency.

The present invention has been accomplished on the basis of the above findings and it contemplates to provide an improved MW-PCVD apparatus.

The MW-PCVD apparatus according to the present invention comprises a substantially enclosed reaction chamber (film-forming chamber) having a discharge space which is provided with a microwave introducing window to which a waveguide extending from a microwave power source is connected, said reaction chamber being provided with means for supporting a substrate on which a film is to be formed in said discharge space, said reaction chamber being provided with means for evacuating its inside and means for supplying a film-forming raw material gas into said reaction chamber, characterized in that said means for supplying a film-forming raw material gas comprises a gas supply pipe at least part of which being situated in said discharge space and said part of gas supply pipe is provided with a mechanism capable of causing an electric field between said substrate and said part of gas supply pipe situated in said discharge space.

More particularly, the MW-PCVD apparatus according to the present invention is characterized by having the raw material gas supply means capable of serving as a bias electrode which functions to provide an electric field between the substrate and the electrode during film formation. Because of this, a desirable semiconductor deposited film of excellent quality is effectively and stably formed all over the substrate even if it is of large area at an improved deposition rate and with an improved gas utilizing efficiency. And the resultant semiconductor deposited film has a wealth of practically applicable characteristics and is superior to that obtained by the known MW-PCVD apparatus.

The reasons why the above advantages are brought about by the MW-PCVD apparatus according to the present invention can be explained in the following way. That is, the gas supply means situated in the discharge space of the MW-PCVD apparatus of the present invention serves to supply a film-forming raw material gas into the discharge space and concurrently, serves as a bias electrode to provide an electric field between the substrate and the gas supply means during film formation.

In this connection, the film-forming raw material gas as supplied is well excited and decomposed with the action of plasma generated in the discharge space before it reaches the substrate; since an electric field is applied simultaneously with the supply of the film-forming raw material gas, electrons gather about the gas supply means to further enhance the decomposition of the film-forming raw material gas; thus, the film-forming raw material gas is sufficiently decomposed into desirable precursors having high energy and high surface mobility on the substrate; and as a result, a desirable semiconductor deposited film with low internal stress and excellent characteristics is formed on the substrate at a high deposition rate and with a high gas utilizing efficiency.

Thus, the MW-PCVD apparatus of the present invention ensures to uniformly form a desirable deposited film on a substrate of large area at a high deposition rate and with a high gas utilizing efficiency.

The MW-PCVD apparatus of the present invention ensures obtaining a desirable electrophotographic photosensitive member having a light receiving layer comprised of an amorphous silicon material which has a remarkably improved charge retentivity and a remarkably reduced residual potential. The foregoing qualities are hardly attained by the known MW-PCVD apparatus.

The foregoing advantages of the present invention are more effectively provided in the case of a MW-PCVD apparatus having the constitution as shown in FIGS. 3(A) and 3(B) which has a discharge space encircled by a plurality of cylindrical substrates, on each of which a film is to be deposited.

That is, it makes possible effectively mass-producing desirable electrophotographic photosensitive drums which meet the requirements for high speed electrophotographic copying systems and which enable widening the latitude for the charging mechanism and also providing a high speed mechanism in said system at a reduced cost.

BRIEF DESCRIPTION OF THE DRAWINGS

FIGS. 12, 13 and 14 are, respectively, a graph showing the relation between the charge retentivity of deposited film and the gaseous pressure at the time of film formation (FIG. 12), a graph showing the relation between the residual potential of deposited film and the gaseous pressure at the time of film formation (FIG. 13), and a graph showing the relation between the deposition rate for deposited film and the gaseous pressure at the time of film formation (FIG. 14), each in Example 4.

DESCRIPTION OF THE PREFERRED EMBODIMENTS

Embodiments of the MW-PVCD apparatus according to the invention are described with reference to FIGS. 1 to 3. It should be noted that the present invention is not construed as limiting to those embodiments described hereinafter.

Figure 1:
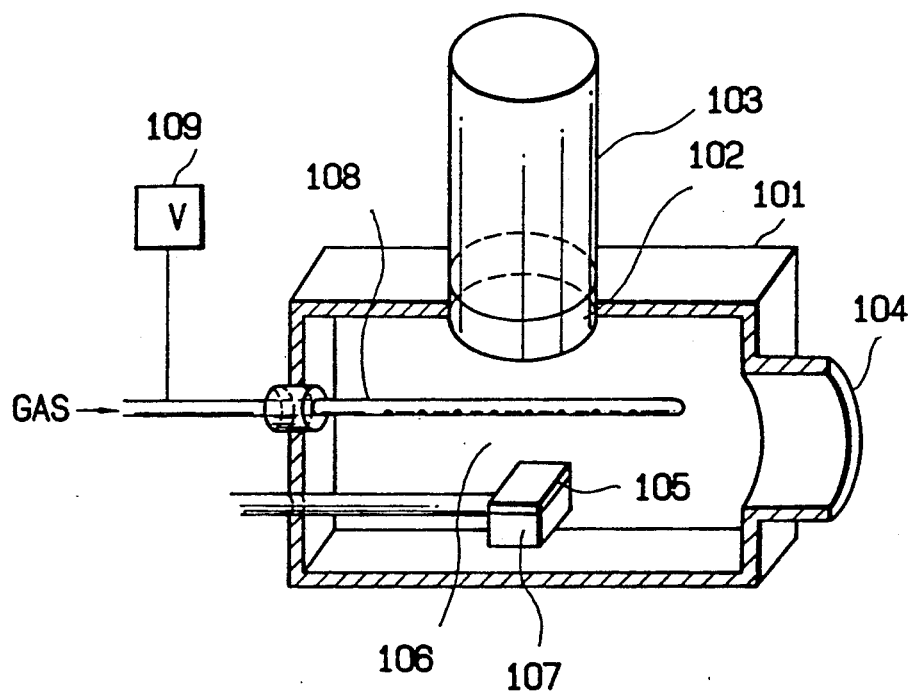
FIG. 1 is a schematic explanatory view of a MW-PCVD apparatus according to one embodiment of the present invention.

The MW-PCVD apparatus shown in FIG. 1 is for film deposition on a flat substrate. The MW-PCVD apparatus shown in FIG. 2 is for film deposition on a plurality of flat substrates. The MW-PCVD apparatus shown in FIG. 3 is for film deposition on a plurality of cylindrical substrates wherein the gas supply means is longitudinally installed at the apparent center position of the cylindrical discharge space encircled by said plurality of cylindrical substrates and an electric field is established between the gas supply means and the cylindrical substrates.

In FIG. 1, indicated at 101 is a reaction chamber (film-forming chamber), at 102 is a microwave introducing window, at 103 is a waveguide, at 104 is an exhaust pipe, at 105 is a flat plate, at 106 is a discharge space, at 107 is a substrate holder, at 108 is a gas supply means, and at 109 is a bias power source. In FIG. 2, indicated at 201 is a reaction chamber (film-forming chamber), at 202 is a microwave introducing window, at 203 is a waveguide, at 204 is an exhaust pipe, at 205 are a plurality of flat plate substrates, at 206 is a discharge space, at 207 is a substrate holder, at 208 is a gas supply means, and at 209 is a bias power source. In FIG. 3, indicated at 301 is a reaction chamber (film-forming chamber), at 302 is a microwave introducing window, at 303 is a waveguide extending from a microwave power source (not shown), at 304 is an exhaust pipe, at 305 are cylindrical substrates, each being positioned on a rotatable cylindrical substrate holder (not shown), at 306 is a cylindrical discharge space encircled by a plurality of cylindrical substrate holders, at 307 is a heater, at 308 is a gas supply means, at 309 is a bias power source, and at 311 is a rotating mechanism for rotating the cylindrical substrate holder.

Figure 3A:
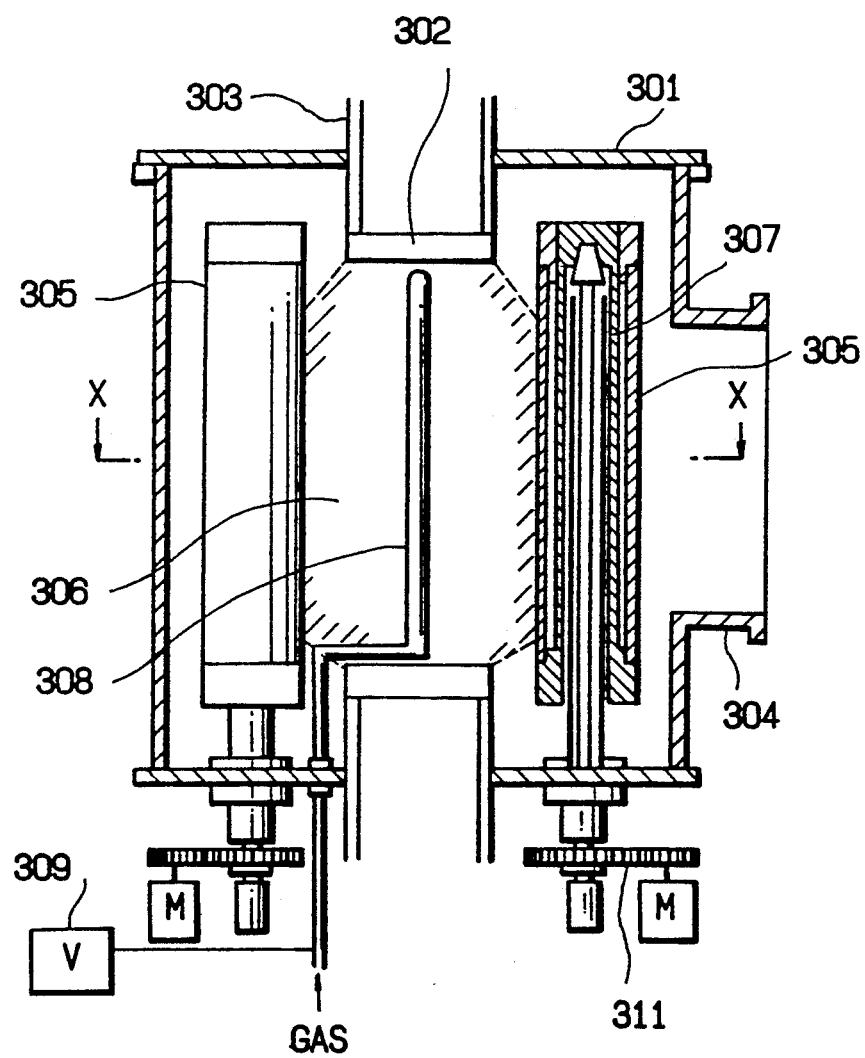
FIG. 3(A) is a schematic explanatory view, in longitudinal section, of a MW-PVCD apparatus according to a further embodiment of the present invention.
Figure 3B:
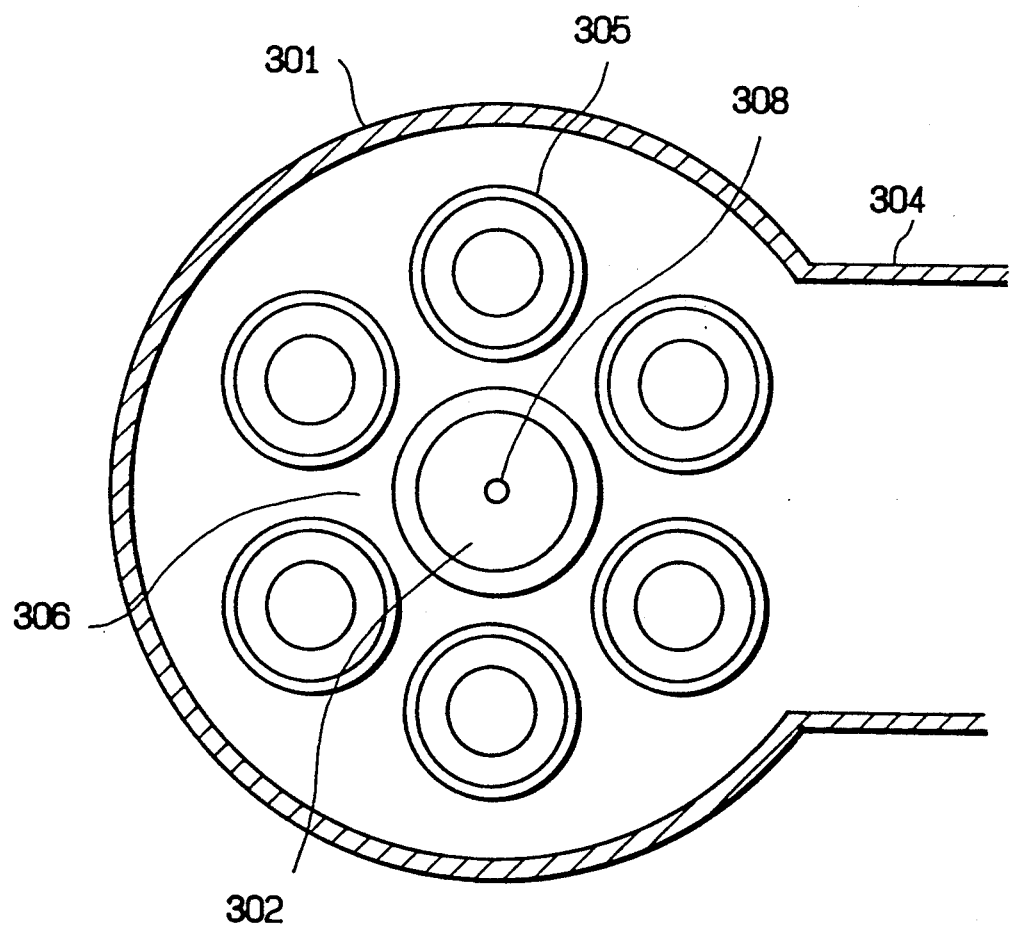
FIG. 3(B) is a cross-sectional view taken along the line X—X of the apparatus of FIG. 3(A).

The film-forming process using the MW-PCVD apparatus of the present invention is carried out in the following manner, for example, in the case of the MW-PCVD apparatus shown in FIGS. 3(A) and 3(B).

The reaction chamber 301 is evacuated to a desired vacuum through the exhaust pipe 304 by means of a vacuum pump (not shown). Subsequently, the cylindrical substrates are heated to and kept at a predetermined temperature by energizing the heater 307. The cylindrical substrates 305 are rotated by means of the rotating mechanism 311, and a film-forming raw material gas such as silane gas ($SiH_4$), diborane ($B_2H_4$) or the like is supplied into the reaction chamber 301 through the gas supply means 308. Then, a predetermined DC voltage from the bias power source 309 is applied to the gas supply pipe 308. Concurrently, a microwave of 2.45 GHz generated from the microwave power source is passed into the discharge space 306 through an impedance matching box (not shown), the waveguide 303 and the microwave introducing dielectric window 302.

The raw material gas as introduced into the discharge space 306 is excited with the action of microwave energy and dissociated into neutral radical particles, ion particles, electrons, etc., which are interacted, to thereby cause the formation of a deposited film over the entire surface of each of the rotating cylindrical substrates 305. In a preferred embodiment, the gas supply means in the present invention comprises a gas feed pipe provided with a plurality of gas liberation holes.

The gas feed pipe used in the present invention may be formed of a conductive material such as metals e.g. Al, Cr, Mo, Au, In, Nb, Ni, Te, V, Ti, Pt, Pd or Fe, or alloys thereof such as stainless steel. The gas feed pipe may be also formed of a glass and ceramics whose surface is treated to impart conductivity thereto.

The gas feed pipe is not critical with respect to the shape. However, it is most desirable to be in a cylindrical form. The size of the gas feed pipe is properly determined depending upon the scale of the discharge space. However in general, the gas feed pipe is desired to be of a size with respect to the cross sectional diameter which is preferably at least 3 mm and most preferably in the range of from 5 to 20 mm.

As for the length of the gas feed pipe, there is not any particular limitation therefor. However, in any case, the length of the gas feed pipe is important to be so designed that an electric field be effectively and uniformly caused onto the substrate upon application of a bias voltage on the gas feed pipe and the raw material gas be uniformly dispersed against all over the surface of the substrate which is exposed to plasma. In a preferred embodiment in this respect, the length of the gas feed pipe is designed to be equal to or longer by about 0.1 to 50 mm than the length of the substrate in the case of the MW-PCVD apparatus shown in FIG. 3.

The gas liberation holes to be provided with the gas feed pipe may comprise nozzles or orifices. They are arranged with the gas feed pipe such that the raw material gas can be effectively and uniformly released against the substrate. In alternative, the gas liberation holes may comprise a porous material capable of releasing the raw material gas through said porous material into the discharge space. In a preferred embodiment in the case of the MW-PCVD apparatus shown in FIG. 3, the gas feed pipe is provided with a plurality of gas liberation holes radiately in all the directions so that the raw material gas can be radiately released in all the directions toward the cylindrical substrate holders in the discharge space. In this case, the gas feed pipe is desired to be provided with a plurality of gas liberation holes with a density of 0.1 to 2 holes/cm$^2$. Each of the gas liberation holes is desired to be of a size preferably in the range of 0.4 to 2.5 mm$^2$ or more preferably in the range of 0.6 to 1.5 mm$^2$.

In the MW-PCVD apparatus of the present invention, the electric field generated between the starting gas feed pipe and the substrate should preferably be a DC electric field. It is most desired for the electric field to be made in the direction from the gas feed pipe toward the substrate. In order to generate the DC electric field between the gas feed pipe and the substrate, a DC bias voltage which is applied to the gas feed pipe is generally in the range of from 15 to 300 volts, preferably from 30 to 200 volts. The waveform of the DC bias voltage to be applied to the gas feed pipe so as to cause a DC electric field is not critical. More particularly, any waveform may be used unless the direction of the bias voltage varies depending on the time. For instance, not only a constant voltage whose magnitude does not vary in relation to the time but also a pulse-like voltage or a ripple voltage which has been rectified by means of a rectifier and whose magnitude varies depending on the time may also be employed.

In the present invention, AC bias voltage is also usable. In this case, the AC frequency is not critical and is preferably at least 20 Hz. In practice, a low frequency of 50 Hz or 60 Hz or a high frequency of 1.56 MHz is appropriate. The waveform may be either a sine waveform or a rectangular waveform, or other waveforms may be used. In practice, the sine wave is appropriate. It should be noted that the term "voltage" used herein means an effective value.

The MW-PCVD apparatus of the present invention set forth above have the following features and advantages.

In the MW-PCVD apparatus of the present invention having such arrangements as described above, the gas gas is provided in the discharge space, so that the raw material gas as supplied is excited and decomposed with the action of microwave energy before it reaches the substrate. Moreover, electrons having a great energy which are accelerated by the electric field over the whole area of the discharge space are present around the gas supply means and thus, the excitation and decomposition of the raw material gas proceed smoothly and sufficiently. This entails a remarkable improvement in the utilizing efficiency of the raw material gas.

And the raw material gas has been sufficiently decomposed and converted into desirable precursors, having a high energy and exhibiting a high surface mobility on the substrate. As a result, there can be formed a desirable deposited film of high quality and having a low inner stress.

Upon introducing the raw material gas into the reaction chamber, the gas supply means is applied with a bias voltage, so that ions formed as a result of ionization with plasma are sufficiently accelerated by the electric field as caused and are bombarded on the substrate as having great kinetic energy. This enables the resulting deposited film to be locally annealed even with a relatively low bias voltage as applied to the gas supply means, mitigating the stress in the film and reducing possible defects. Thus, a desirable deposited film having good characteristics can be formed.

When a deposited film is formed by the MW-PCVD apparatus of the present invention, the inner pressure of the reaction chamber is maintained preferably at 100 mTorr or less, more preferably at 50 mTorr or less, within which better results are obtained.

As the film-forming raw material gas to be used for forming an amorphous silicon deposited film in the present invention, there can be mentioned, for example, silane (SiH$_4$), disilane (Si$_2$H$_6$) and the like. In the present invention, it is possible to form other amorphous deposited films, for example, by using a proper film-forming gas such as german (GeH$_4$) or the like.

In any case, the film-forming raw material gas may be diluted with a dilution gas such as H$_2$, Ar, or He.

Further, in order to vary the band gap of a deposited film to be formed, there can be used a nitrogen atom-containing gas such as N$_2$ and NH$_3$, an oxygen atom-containing gas such as O$_2$, NO or NO$_2$, or a hydrocarbon such as CH$_4$, C$_2$H$_6$, C$_2$H$_4$, C$_2$H$_2$, or C$_3$H$_8$. Other than these, it is possible to use a fluoride such as SiF$_4$, Si$_2$F$_6$, or GeF$_4$. These gases may be used alone or in combination.

In the present invention, a dopant gas such as diborane (B$_2$H$_6$), phosphine (PH$_3$) or the like can be effectively introduced into the discharge space for doping purposes concurrently with the raw material gas.

Examples of the material which can be used as the substrate in the present invention include metals such as stainless steel, Al, Cr, Mo, Au, In, Nb, Te, V, Ti, Pt, Pd, Fe and the like, alloys of these metals, and synthetic resins like polycarbonate, and glass, ceramics or paper with a suitable surface treated to have an electrical conductivity.

As for the substrate temperature at the time of forming a deposited film in the present invention, it is maintained at a temperature preferably in the range of 20° C. to 500° C., more preferably in the range of 50° C. to 450° C.

As the means of introducing microwave into the discharge space in the present invention, it is possible to use a coaxial cable other than the foregoing microwave introducing means. In this case, it is possible to provide one or more antennas in the film-forming chamber. And as for the microwave introducing window in this case, it is formed of a material which involves less microwave losses, including alumina, aluminum nitride, silicon nitride, silicon carbide, silicon oxide, beryllium oxide, teflon, polystyrene and the like.

The present invention is applicable to preparing not only photosensitive drums for electrophotographic copying machines but also other electronic devices to be used, for example, in printers, including blocking type amorphous silicon photosensitive members, high resistance type amorphous silicon photosensitive members.

The MW-PCVD apparatus of the present invention will be explained in more detail by the following examples which, however, are given for the purpose of illustration and should not be construed as limitative of the present invention.

EXAMPLE 1 AND COMPARATIVE EXAMPLE 1

Figure 4:
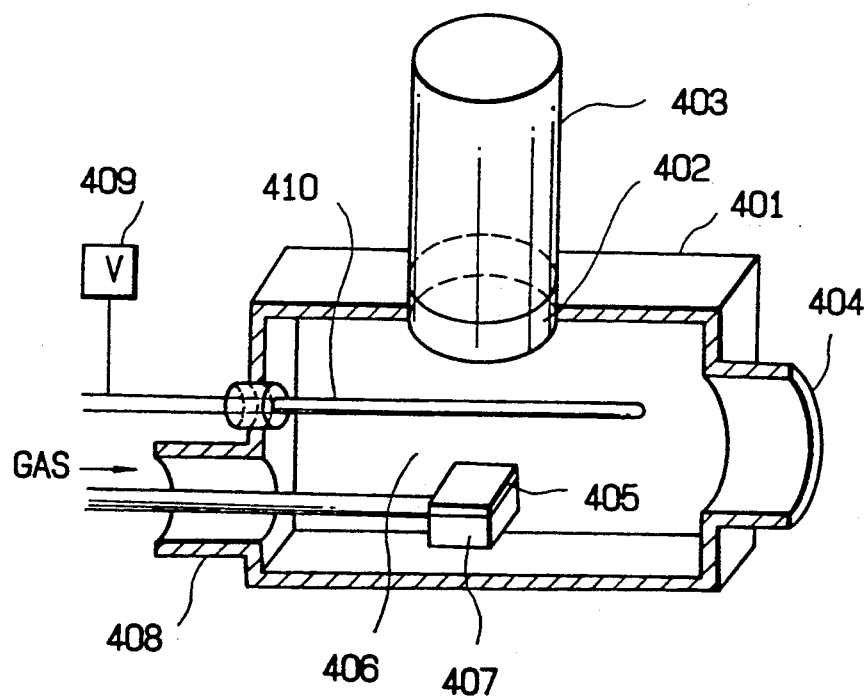
FIG. 4 is a schematic explanatory view of a known MW-PVCD apparatus of the type using one substrate.

The MW-PCVD apparatus of the present invention shown in FIG. 1 (in Example 1) and the known MW-PVCD shown in FIG. 4 (in Comparative Example 1) were used to prepare photosensitive members for use in electrophotography according the procedures described before. Each of the photosensitive members was made to have a light receiving layer comprising a charge injection inhibition layer, a photoconductive layer and a surface layer being laminated in this order on an aluminum substrate. The film-forming conditions of these layers were made as shown in Table 1, except that a DC bias voltage applied upon forming the photoconductive layer was varied from −300 V to +300 V. The bias voltage was applied to the foregoing gas feed pipe in Example 1. In the case of Comparative Example 1, the bias voltage was applied to the electrode.

Each of the thus obtained electrophotographic photosensitive members was evaluated with respect to the charge retentivity, sensitivity and deposition rate in accordance with the following evaluation procedures.

(1) Evaluation of the charge retentivity ($V_d$)

A deposited film is set to a conventional charge and exposure testing device wherein it is subjected to corona discharge at ⊕6.3 KV for 0.2 seconds, whereupon the surface potential in dark of the deposited film is measured by a surface potentiometer.

(2) Evaluation of the residual potential ($V_R$)

A deposited film is charged at a given dark surface potential and immediately irradiated with a light image. The irradiation of the light image is carried out by using a xenon lamp light source and irradiating the remaining light after removing the light in the wavelength region of less than 550 nm at a given quantity. And the surface potential in light of the deposited film is measured by a surface potentiometer.

(3) Evaluation of the deposition rate ($D_R$)

The thickness of a deposited film is measured by a thickness measuring meter to determine the deposition rate ($D_R$).

Figure 6:
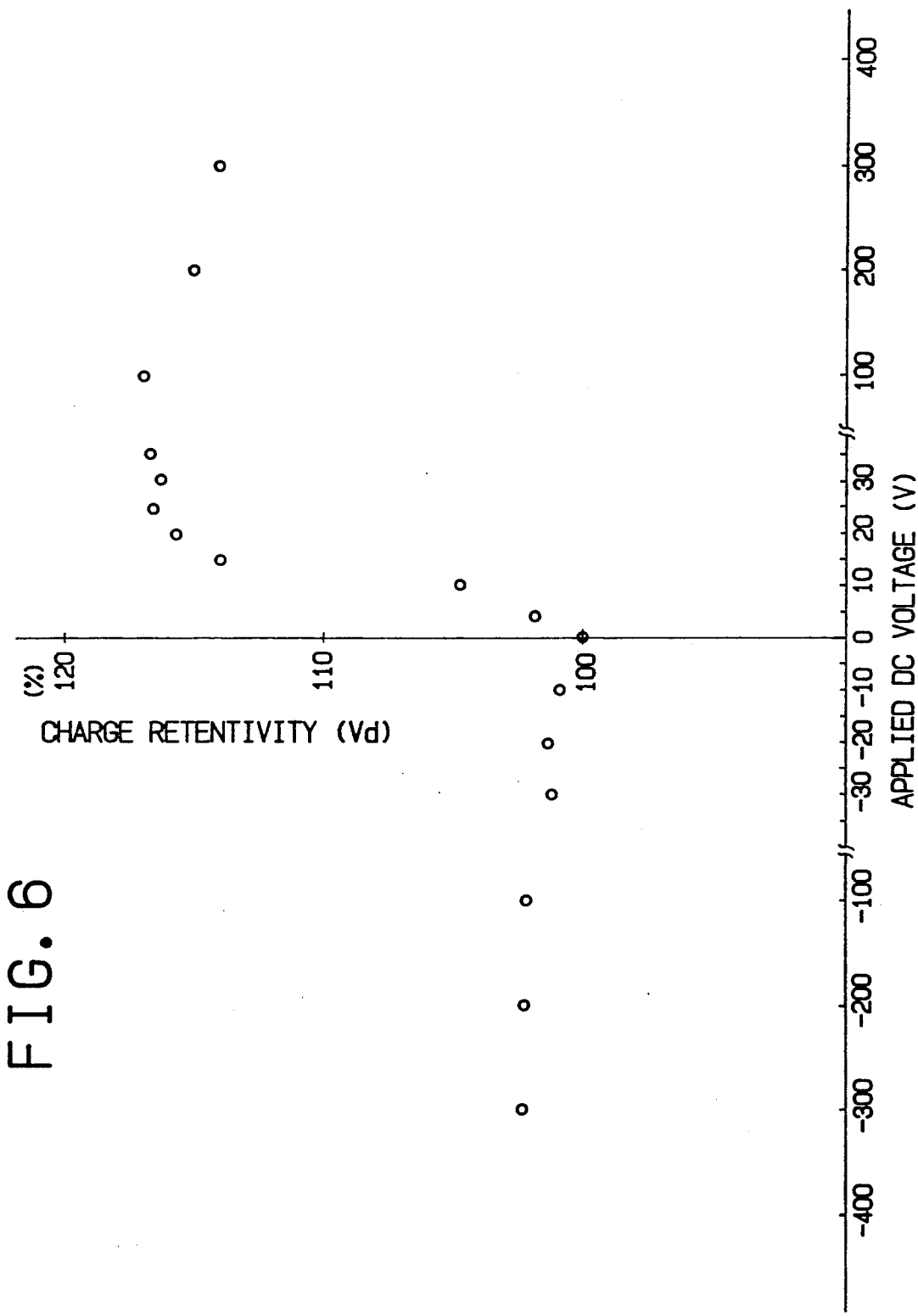
FIGS. 6, 7 and 8 are, respectively, a graph showing the relation between the charge retentivity (Vd) and the applied DC voltage (V)(FIG. 6), a graph showing the relation between the residual potential (VR) and the applied DC voltage (V)(FIG. 7), and a graph showing the relation between the deposition rate and the applied DC voltage (V)(FIG. 8), each for the photosensitive materials of Example 1 and Comparative Example 1.
Figure 7:
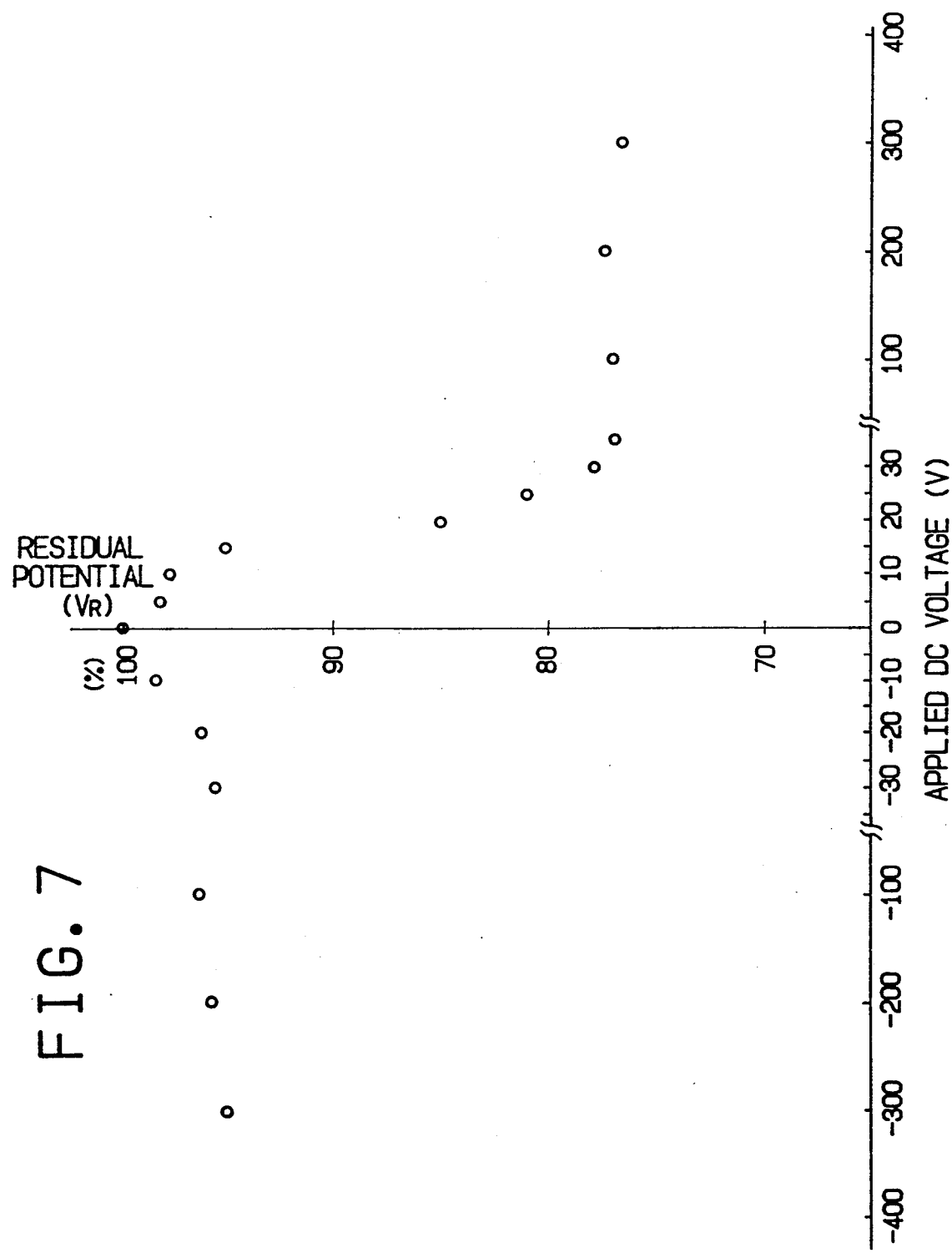
Figure 8:
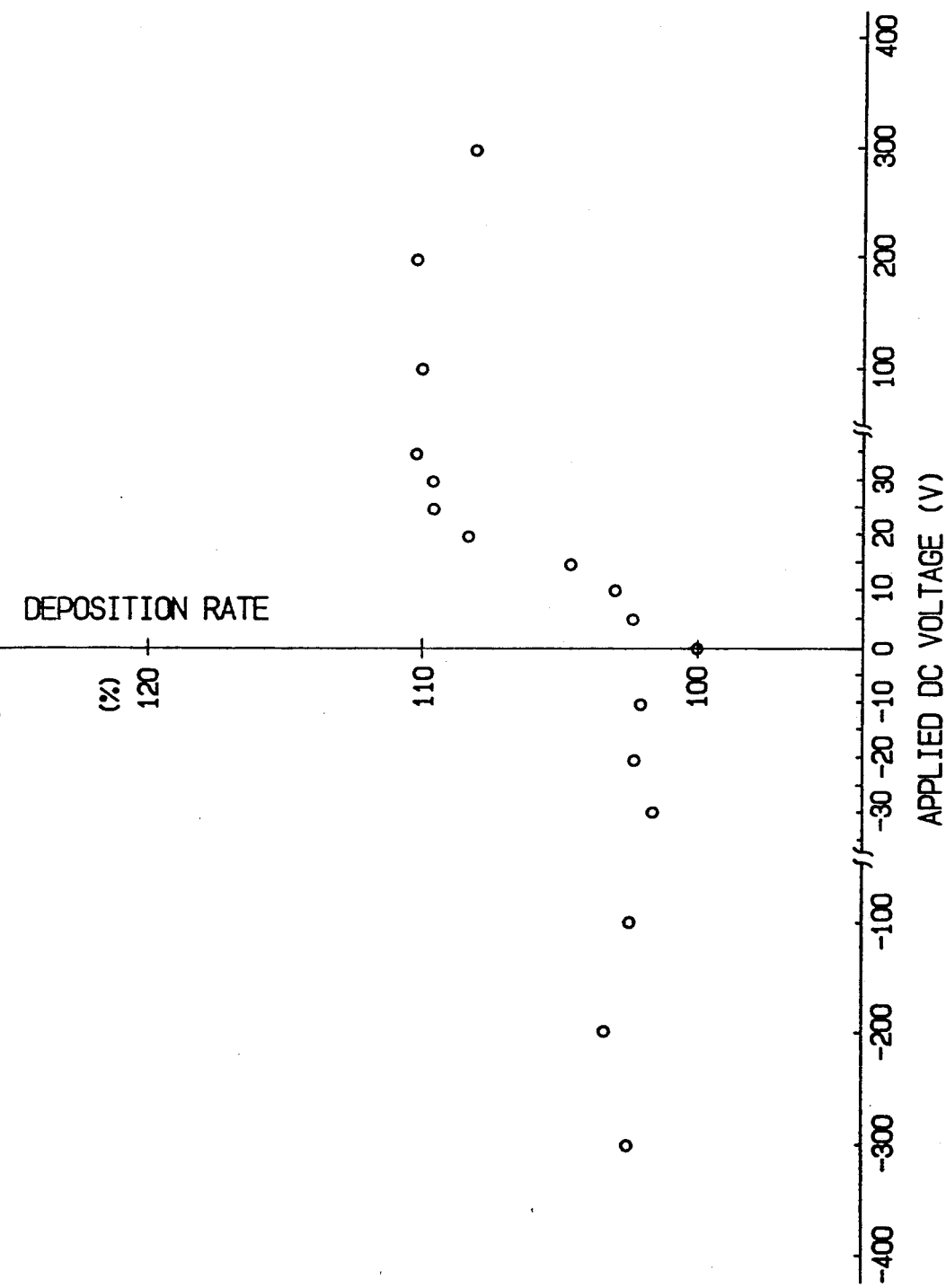

The results obtained in the above evaluations were shown as the surface potential characteristics of each of the resultant electrophotographic photosensitive members; the charge retentivity shown in FIG. 6, the residual potential shown in FIG. 7 and the deposition rate shown in FIG. 8.

In each of the figures, the abscissa axis indicates a bias voltage applied to the photoconductive layer at the time of preparing the photosensitive member and the ordinate axis indicates a relative proportion of the measured value for the photosensitive member obtained in Example 1 versus the measured value for the photosensitive member obtained in Comparative Example 1.

In both Example 1 and Comparative Example 1, when a DC bias voltage was applied, either positively or negatively, at values larger than 300 V, abnormal discharge such as spark took place, with significant lowerings of the quality and reproducibility of a deposited film.

The results obtained in Example 1 and those obtained in Comparative Example 1 were assessed in the following manner.

The DC bias voltages (V), in Comparative Example 1 were determined for obtaining the same values of the charge retentivity, residual potential and deposition rate as obtained at the applied DC bias voltages of 20 V and 100 V in Example 1. The results were as shown in Table 2.

It has been found from the foregoing results that in order to obtain the same electric characteristics at the applied DC voltage of 20 V in the MW-PCVD apparatus of the present invention, a DC bias voltage of about 250 V has to be applied in the case of the known MW-PCVD apparatus; with respect to the deposition rate, a bias voltage of more than 300 V is necessary to be applied in the case of the known MW-PCVD apparatus; and in consequence, there is a significant difference between the MW-PCVD apparatus of the present invention and the known MW-PCVD apparatus.

Further, it has been found that in order to obtain the values obtained by application of a bias voltage of 100 V in the MW-PCVD apparatus of the present invention, a bias voltage of more than 300 V is required to be applied for both the electric characteristics and the deposition rate in the case of the known MW-PCVD apparatus. However, in the case of the known MW-PCVD apparatus, when a voltage over 300 V was applied, abnormal discharge such as spark occurred, thus causing film characteristics to be considerably lowered with a significant lowering of reproducibility, and accordingly, accurate values could not be obtained.

From these results, it has been confirmed that the MW-PCVD apparatus of the present invention is significantly improved over the known MW-PCVD apparatus for any applied DC bias voltage with respect to the charge retentivity, residual potential and deposition rate.

In particular, when the foregoing gas feed was applied with a positive DC bias voltage, these characteristics of the deposited film obtained by the MW-PCVD apparatus of the present invention were found to be remarkably improved as compared with those of the deposited film formed by the known MW-PCVD apparatus. In addition, in the case of the MW-PCVD apparatus of the present invention, significant effects were recognized when the positive applied DC bias voltage was made to be more than 15 V and particularly, more than 30 V.

COMPARATIVE EXAMPLE 2

Figure 5:
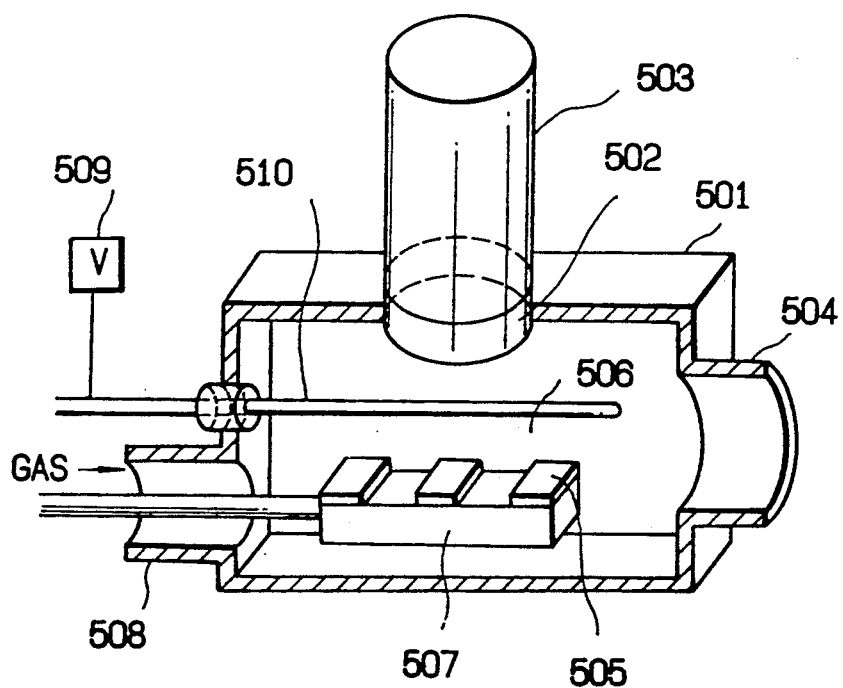
FIG. 5 is a schematic explanatory view of a known MW-PVCD of the type using a plurality of substrates.

The known MW-PCVD apparatus shown in FIG. 5 was used to prepare a deposited film under the same conditions as used in Comparative Example 1 and Example 1. In this case, a plurality of substrates were placed in the reaction chamber and a maximum distance between the adjacent substrates was made to be 300 mm. The deposited film thus prepared was evaluated with respect to the charge retentivity, residual potential and deposition rate in the same manner as in Example 1. As a result, it has been found that the charge retentivity, residual potential and deposition rate are not uniform. More particularly, the characteristics became nonuniform at the upstream side (inlet side of the raw material gas) and at the downstream side (raw material gas exhaust side).

EXAMPLE 2

Figure 2:
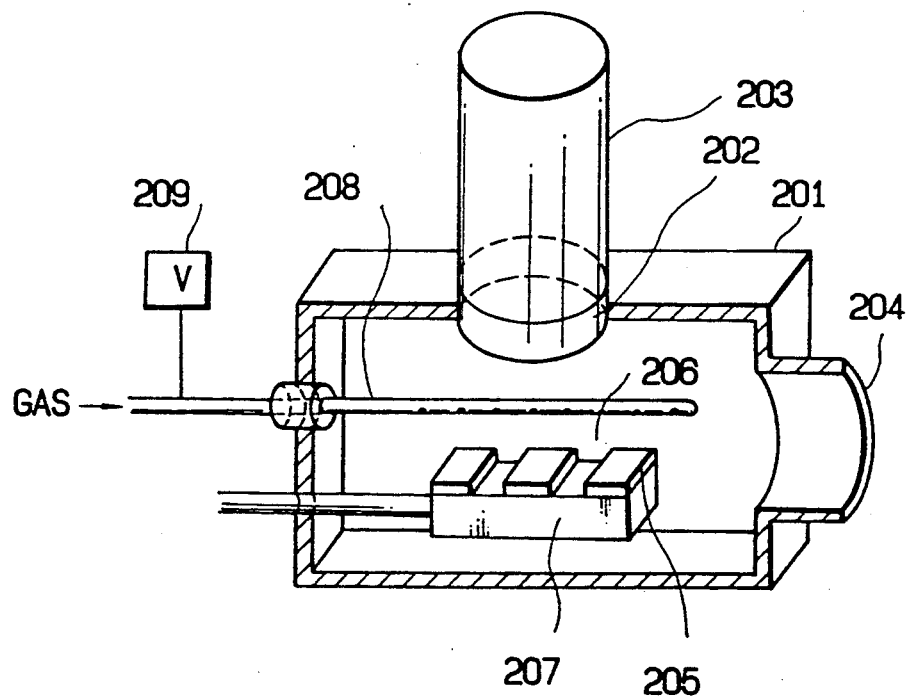
FIG. 2 is a schematic explanatory view of a MW-PVCD apparatus according to another embodiment of the present invention.

Using the MW-PCVD apparatus of the present invention shown in FIG. 2, there were prepared a plurality of electrophotographic photosensitive members under the film-forming conditions as shown in Table 1. Each of the resultants was evaluated with respect to the charge retentivity, sensitivity and deposition rate in the same manner as in Example 1. And there was obtained an evaluated value for each of the evaluation items in view of unevenness in the following way.

Unevenness for charge retentivity $\Delta V_d = V_d$ MAX (maximum charge retentivity value in the deposited film) $- V_{MIN}$ (minimum charge retentivity value in the deposited film)

Unevenness for sensitivity $\Delta V_L = V_L$ MAX (maximum light surface potential value in the deposited film) $- V_{MIN}$ (minimum light surface potential value in the deposited film)

Unevenness for deposition rate $\Delta D_R = D_{R\ MAX}$ (maximum deposition rate in the deposited film) $- D_{R\ MIN}$ (minimum deposition rate in the deposited film)

The evaluated results were as shown in Table 3.

In Table 3, the values obtained in Example 2 are indicated as percentage based on those values obtained in Comparative Example 2, that is: (the value obtained in Example 2)/(the value obtained in Comparative Example 2)×100 (%).

From these results, it is understood that the MW-PCVD apparatus of the present invention is more effective in obtaining a deposited film having an uniform thickness and quality in the preparation of a device of a large area such as, for example, a photosensitive member for use in electrophotography in composition with the known MW-PCVD apparatus.

EXAMPLE 3

Using the MW-PCVD apparatus of the present invention shown in FIG. 1 and the known MW-PCVD apparatus shown in FIG. 4, there were prepared electrophotographic photosensitive members each having a light receiving layer comprising a charge injection inhibition layer, a photoconductive layer and a surface layer being laminated in this order on an aluminum substrate under the film-forming conditions shown in Table 1 for forming the charge injection inhibition layer and the surface layer, wherein the flow rate of the raw material gas was changed upon forming the photoconductive layer.

Figure 9:
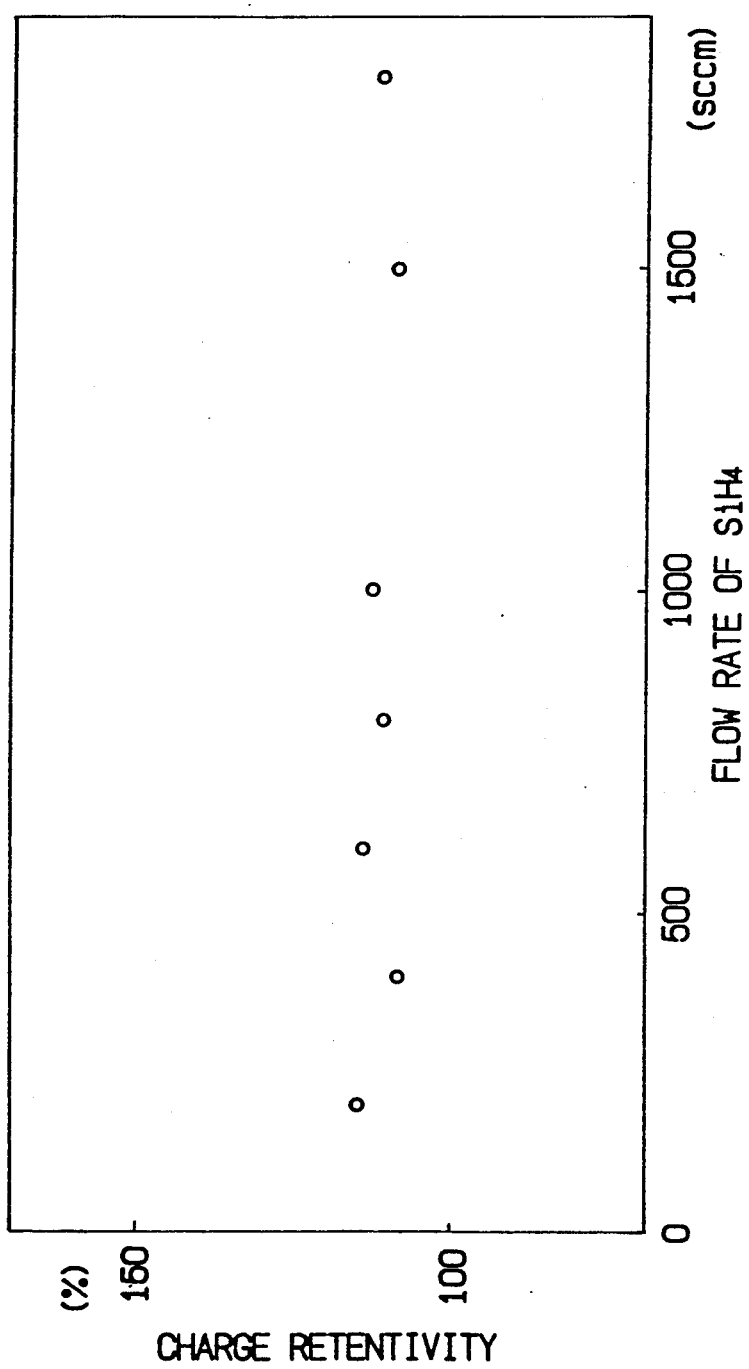
FIGS. 9, 10 and 11 are, respectively, a graph showing the relation between the charge retentivity of deposited film and the flow rate of $SiH_4$ gas (FIG. 9), a graph showing the relation between the residual potential of and a graph showing the relation between the deposition rate for deposited film and the flow rate of $SiH_4$ gas (FIG. 11), each in Example 3.
Figure 10:
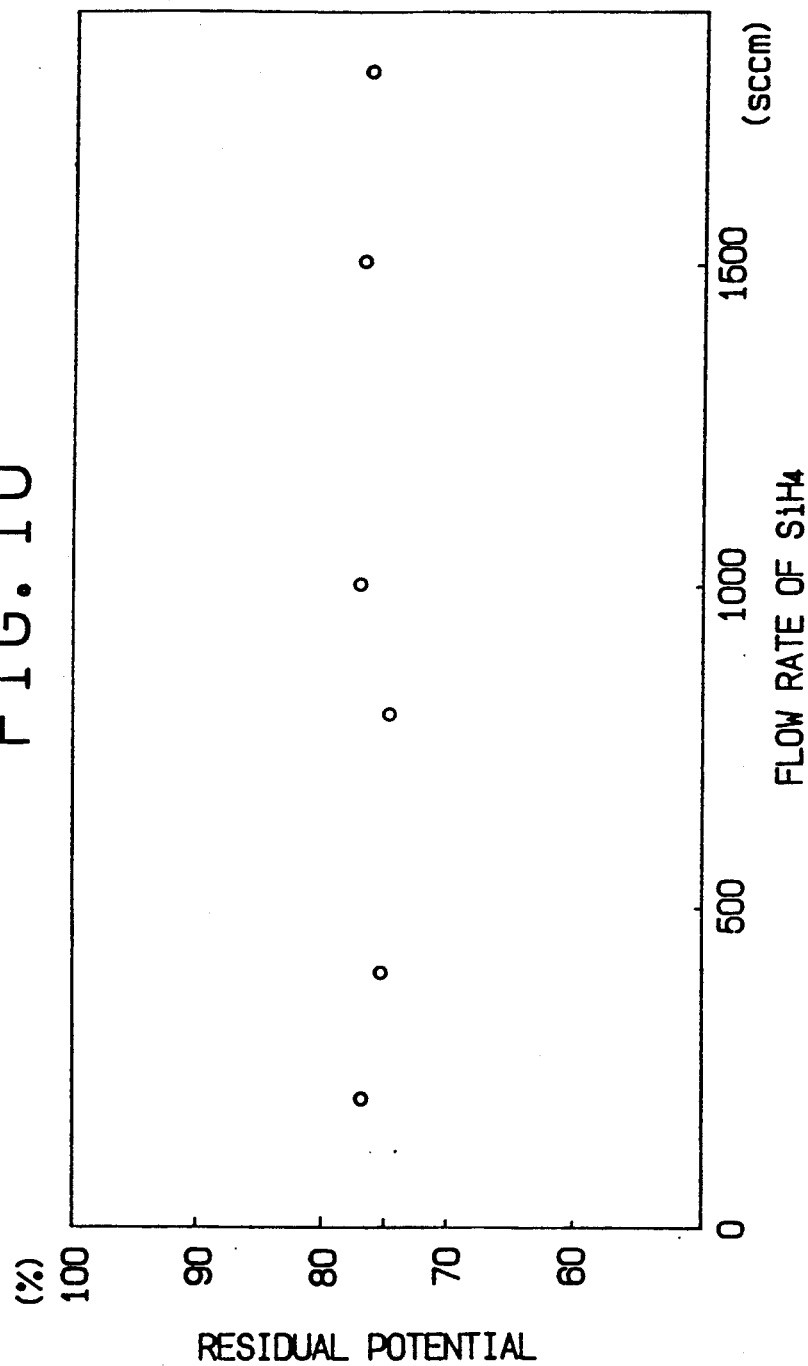
Figure 11:
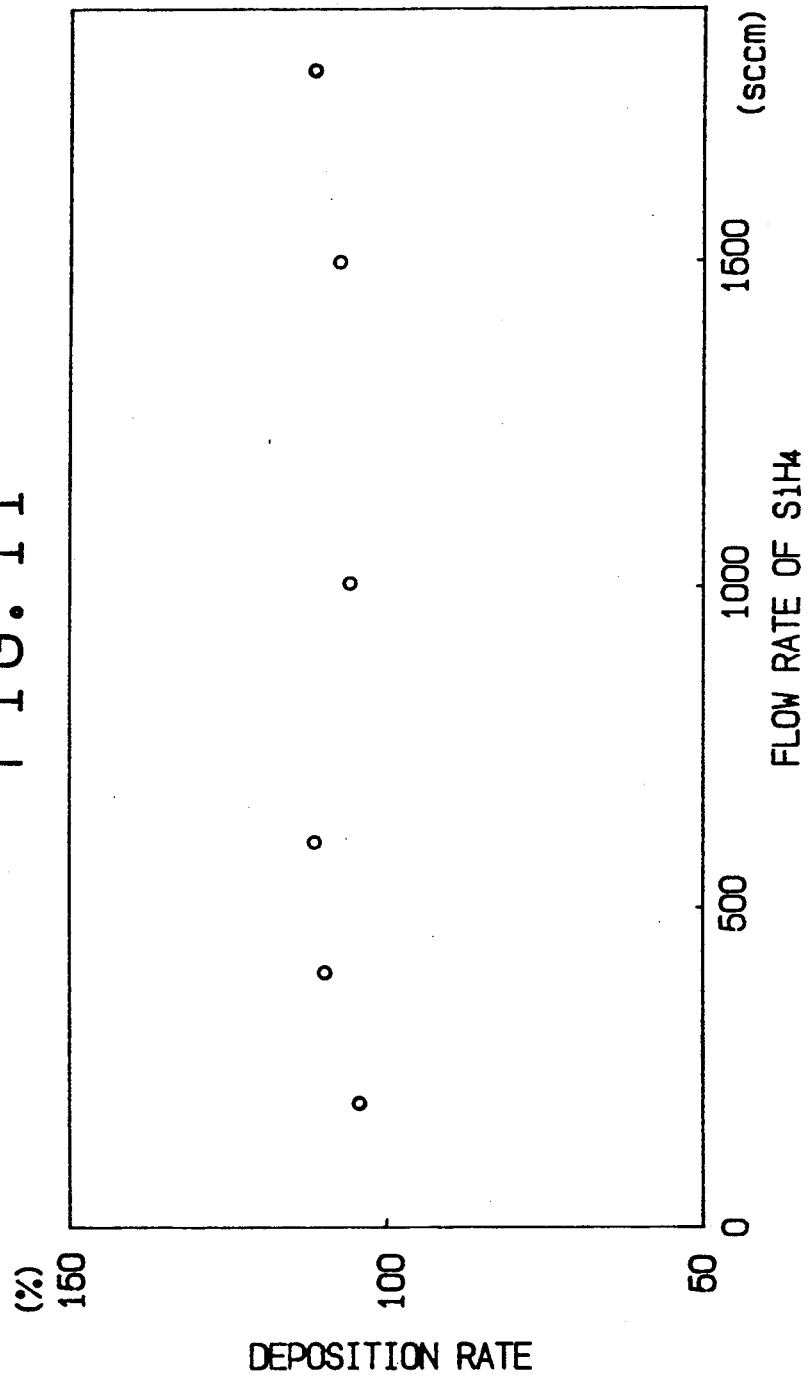

Each of the resultants was evaluated with respect to the charge retentivity, residual potential and deposition rate, with the results shown in FIGS. 9, 10 and 11, respectively.

In FIG. 9, the abscissa axis indicates the flow rate of silane gas ($SiH_4$) at the time of forming the photoconductive layer and the ordinate axis indicates a charge retentivity value which is a dark surface potential at a developing position determined by setting the resultant obtained by the MW-PCVD apparatus of the present invention to a charge and exposure testing device and charging it with a given primary current. In this connection, the value of 100% at the ordinate axis is a charge retentivity value of the resultant obtained at the same flow rate of silane gas by the use of the known MW-PCVD apparatus.

In FIG. 10, the abscissa axis indicates the flow rate of silane gas at the time of forming the photoconductive layer, and the ordinate axis indicates a residual potential which is a surface potential determined by applying a given dark surface potential to the deposited film obtained by the MW-PCVD apparatus of the present invention shown in FIG. 1 and exposing it to light of a given intensity. The value of 100% in the ordinate axis indicates a residual potential of the deposited film obtained at the same flow rate of silane gas by the use of the known MW-PCVD apparatus shown in FIG. 4.

In FIG. 11, the abscissa axis indicates a flow rate of silane gas at the time of forming the photoconductive layer and the ordinate axis indicates a deposition rate of the deposited film obtained by the use of the MW-PCVD apparatus of the present invention. The value of 100% in the ordinate axis indicates a deposition rate of the deposited film obtained at the same flow rate of silane gas by the use of the known MW-PCVD apparatus shown in FIG. 4.

From these results, it has been confirmed that the MW-PCVD apparatus of the present invention can improve the charge retentivity and residual potential characteristics of the resulting deposited film at any flow rate of the raw material gas. Especially, at a flow rate of the raw material gas of 400 sccm or more, the deposition rate is remarkably improved.

EXAMPLE 4

Using the MW-PCVD apparatus of the present invention shown in FIG. 1 and the known MW-PCVD apparatus shown in FIG. 4, there were prepared electrophotographic photosensitive members each having a light receiving layer comprising a charge injection inhibition layer, a photoconductive layer and a surface layer being laminated in this order on an aluminum substrate under the film-forming conditions shown in Table 1 except that the inner pressure of the reaction chamber was changed upon forming the photoconductive layer.

Figure 12:
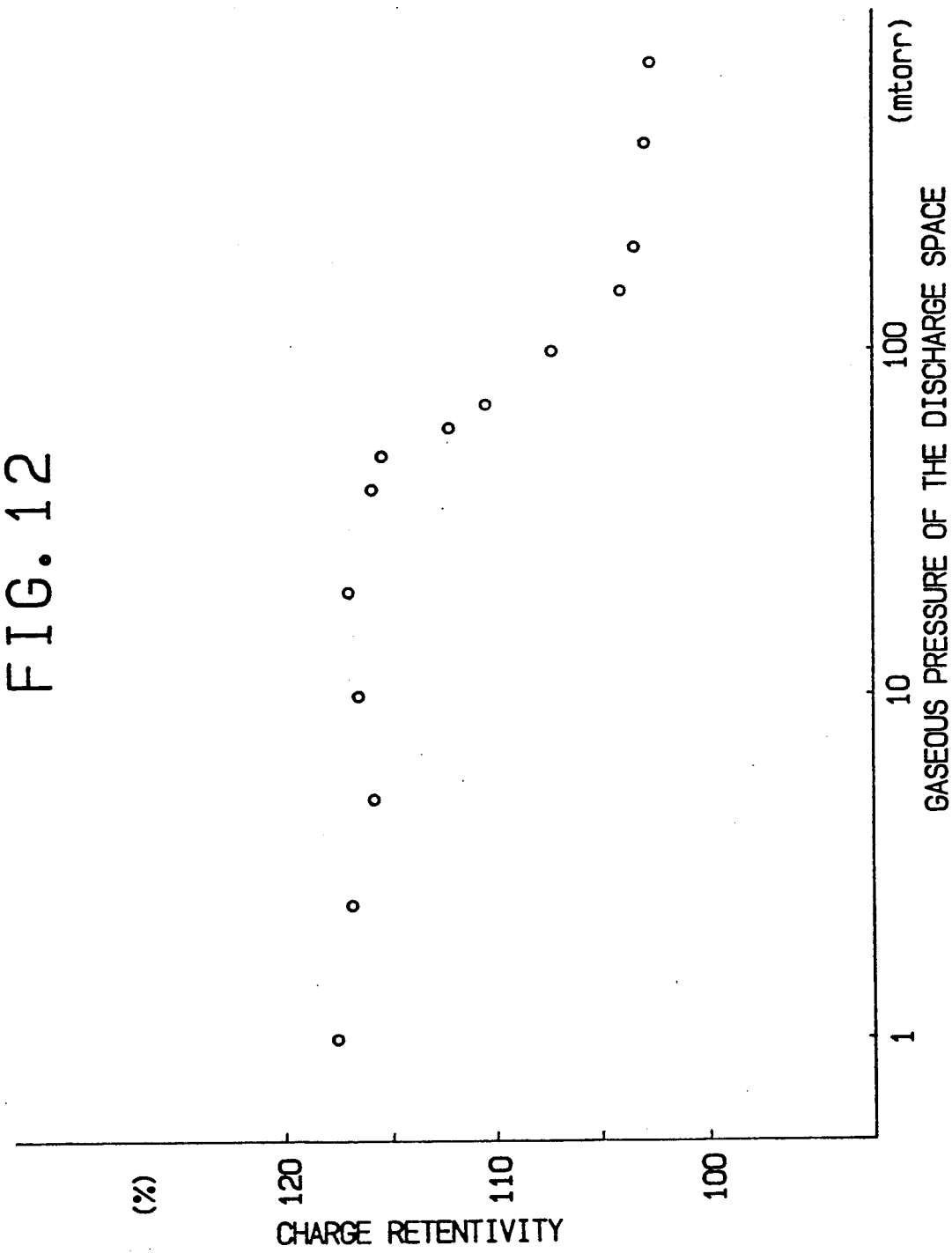

Each of the resultants was evaluated with respect to the charge retentivity, residual potential and deposition rate, with the results shown in FIGS. 12, 13 and 14.

In FIG. 12, the abscissa axis indicates an inner pressure at the time of formation of the photoconductive layer, and the ordinate axis indicates a charge retentivity value which is a dark surface potential determined by setting the resultant obtained by the use of the MW-PCVD apparatus of the present invention shown in FIG. 1 to a charge and exposure testing device and charging it with a given primary current. The value of 100% in the ordinate axis indicates a charge retentivity of the deposited film prepared at the same inner pressure and voltage by the use of the known MW-PCVD apparatus.

In FIG. 13, the abscissa axis indicates an inner pressure at the time of forming of the photoconductive layer, and the ordinate axis indicates a residual potential which is a surface potential determined by applying a given dark surface potential to the deposited film obtained by the use of the MW-PCVD apparatus of the present invention shown in FIG. 1 and exposing it to light at a given intensity. In this connection, the value of 100% in the ordinate axis indicates a charge retentivity of the deposited film obtained at the same inner pressure and voltage by the use of the known MW-PCVD apparatus shown in FIG. 4.

In FIG. 13, the abscissa axis indicates an inner pressure at the time of forming the photoconductive layer, and the ordinate axis indicates a residual potential which is a surface potential determined by applying a given dark surface potential to the deposited film obtained by the use of the MW-PCVD apparatus of the present invention shown in FIG. 1 and exposing it to light at a given intensity. The value of 100% in the ordinate axis indicates a charge retentivity of the deposited film obtained at the same inner pressure and voltage by the use of the known MW-PCVD apparatus shown in FIG. 4.

In FIG. 14, the abscissa axis indicates an inner pressure at the time of forming the photoconductive layer, and the ordinate axis indicates a deposition rate of the deposited film obtained by the use of the MW-PCVD apparatus of the present invention shown in FIG. 1. The value of 100% in the ordinate axis indicates a deposition rate of the deposited film obtained at the same inner pressure by the use of the known MW-PCVD apparatus shown in FIG. 4.

From these results, it has been confirmed that at lower inner pressures, the MW-PCVD apparatus of the present invention is more effective in comparison with the known MW-PCVD apparatus.

In particular, when the inner pressure at the time of forming the photoconductive layer is made to be less than 100 mTorr, the deposited film to be obtained by the MW-PCVD apparatus of the present invention exhibits better electrophotographic characteristics with respect to the charge retentivity and the residual potential than that obtained by the known MW-PCVD apparatus, with an improved deposition rate.

Moreover, when the inner pressure is made to be less than 50 mTorr, the improvement of the characteristics becomes more pronounced with a more improved deposition rate.

TABLE 1

| Film-forming conditions | | charge injection inhibition layer | photo-conductive layer | surface layer |
|---|---|---|---|---|
| gas used and its flow rate | SiH$_4$ (sccm) | 500 | 800 | 200 |
| | H$_2$ (sccm) | 500 | 500 | 0 |
| | B$_2$H$_6$ (ppm) | 2000 | 0 | 0 |
| | NO (sccm) | 20 | 0 | 0 |
| | CH$_4$ (sccm) | 0 | 0 | 1000 |
| inner pressure (mTorr) | | 1.5 | 2 | 3 |
| microwave power (W) | | 700 | 1500 | 1000 |
| applied DC voltage (V) | | 100 | 0 | 15 |

TABLE 2

DC voltage to be applied in the discharge space which is required to provide the same characteristics

| characteristics | Comparative Example 1 | Example 1 |
|---|---|---|
| charge retentivity | 240 V | 20 V |
| | * | 100 V |
| residual potential | 260 V | 20 V |
| | * | 100 V |
| deposition rate | * | 20 V |
| | * | 100 V |

*: denotes the case where it was impossible to measure since the voltage exceeded 300 V

TABLE 3

| charge retentivity $\Delta V_d$ | | Unevenness sensitivity $\Delta V_L$ | | deposition rate $\Delta D_R$ | |
|---|---|---|---|---|---|
| Comparative Example 2 | Example 2 | Comparative Example 2 | Example 2 | Comparative Example 2 | Example 2 |
| 100 (%) | 73 (%) | 100 (%) | 87 (%) | 100 (%) | 85 (%) |

What we claim is:

1. A microwave plasma chemical vapor deposition apparatus comprising a substantially enclosed reaction chamber having a discharge space, said reaction chamber being provided with a microwave introduction window to which a waveguide extending from a microwave power source is connected in order to introduce microwave energy capable of contributing to production of plasma in said reaction chamber, said reaction chamber being provided with means for supporting a substrate on which a film is to be formed in said discharge space, said reaction chamber being provided with means for evacuating the inside of said reaction chamber and means for supplying a film-forming raw material gas into said reaction chamber, characterized in that said means for supplying a film-forming raw material gas comprises a gas supply pipe at least part of which is situated in said discharge space and said gas supply pipe is provided with a bias voltage applying means such that said part of said gas supply pipe situated in said discharge space is capable of serving as a bias electrode to provide an electric field between said substrate and said part of said gas supply pipe situated in said discharge space.

2. The microwave plasma chemical vapor deposition apparatus according to claim 1, wherein the cross sectional diameter of said gas supply pipe is at least 3 mm.

3. The microwave plasma chemical vapor deposition apparatus according to claim 1, wherein the length of said gas supply pipe is longer than the length of said substrate.

4. The microwave plasma chemical vapor deposition apparatus according to claim 3, wherein said gas supply pipe is no more than 50 mm longer than said substrate.

5. The microwave plasma chemical vapor deposition apparatus according to claim 1, wherein said means for applying a voltage is a means capable of causing a DC electric field between said substrate and said part of gas supply pipe.

6. The microwave plasma chemical vapor deposition apparatus according to claim 5, wherein said DC electric field is caused by applying a DC voltage of 15 to 300 volts.

7. The microwave plasma chemical vapor deposition apparatus according to claim 1, wherein said means for applying a voltage is a means for applying an AC bias voltage.

8. The microwave plasma chemical vapor deposition apparatus according to claim 7, wherein said AC bias voltage is of a frequency of more than 20 Hz.

9. The microwave plasma chemical vapor deposition apparatus according to claim 8, wherein said AC bias voltage is of a frequency of 50 Hz, 60 Hz or 1.56 MHz.

10. A microwave plasma chemical vapor deposition apparatus for the formation of a functional deposited film on a plurality of cylindrical substrates by means of microwave plasma chemical vapor deposition, said apparatus comprising a deposition chamber having a wall with an end portion thereof hermetically provided with a microwave introduction window to which a waveguide extending from a microwave power source is connected in order to introduce microwave energy capable of contributing to production of plasma in said deposition chamber, said deposition chamber having a discharge space circumscribed by a plurality of rotatable cylindrical substrate holders, each said substrate holder having one of said cylindrical substrates therein, said plurality of rotatable cylindrical substrate holders being concentrically arranged in said deposition chamber, said deposition chamber being provided with means for supplying a film-forming raw material gas into said discharge space and means for evacuating said deposition chamber, characterized in that said means for supplying a film-forming raw material gas comprises a gas supply pipe being installed in said discharge space longitudinally electric field between said substrate and said part of said gas supply pipe situated in said discharge space.

11. The microwave plasma chemical vapor deposition apparatus according to claim 10, wherein the cross sectional diameter of said gas feed pipe is at least 3 mm.

12. The microwave plasma chemical vapor deposition apparatus according to claim 10, wherein the length of said gas feed pipe is longer than the length of said substrate.

13. The microwave plasma chemical vapor deposition apparatus according to claim 12, wherein said gas feed pipe is no more than 50 mm longer than said substrate.

14. The microwave plasma chemical vapor deposition apparatus according to claim 10, wherein said gas feed pipe is provided with said plurality of gas liberation holes with a density of 0.1 to 2 holes per $cm^3$.

15. The microwave plasma chemical vapor deposition apparatus according to claim 10, wherein each of said plurality of gas liberation holes has an area in the range of 0.4 to 2.5 $mm^3$.

16. The microwave plasma chemical vapor deposition apparatus according to claim 10, wherein said bias voltage is a DC bias voltage.

17. The microwave plasma chemical vapor deposition apparatus according to claim 16, wherein said DC bias voltage is of 15 to 300 volts.

18. The microwave plasma chemical vapor deposition apparatus according to claim 10, wherein said bias voltage is an AC bias voltage.

19. The microwave plasma chemical vapor deposition apparatus according to claim 18, wherein said AC bias voltage is of a frequency of more than 20 Hz.

20. The microwave plasma chemical vapor deposition apparatus according to claim 19, wherein said AC bias voltage is of a frequency of 50 Hz, 60 Hz or 1.56 MHz.

* * * * *

UNITED STATES PATENT AND TRADEMARK OFFICE
CERTIFICATE OF CORRECTION

PATENT NO. : 5,129,359
DATED : July 14, 1992
INVENTOR(S) : TETSUYA TAKEI ET AL.   Page 1 of 3

It is certified that error appears in the above-identified patent and that said Letters Patent is hereby corrected as shown below:

TITLE PAGE [56] REFERENCES CITED

Foreign Patent Documents, "64-56873  3/1989  Japan" should read --1-56873  3/1989  Japan--.

COLUMN 1

Line 38, "hereinafter" should read --[hereinafter--.
    Line 54, "hereinafter" should read --[hereinafter--.
    Line 55, "process"" should read --process"]--.

COLUMN 2

Line 52, "container 401" should read --chamber 401--.
    Line 68, "member" should read --member,--.

COLUMN 3

Line 26, "case," should read --cases,--.

COLUMN 5

Line 46, "MW-PVCD" should read --MW-PVCD apparatus--.
    Line 58, "of" should read --of deposited film and the flow rate of $SiH_4$ gas (FIG. 10),--.

COLUMN 6

Line 9, "limiting" should read --limited--.

UNITED STATES PATENT AND TRADEMARK OFFICE
CERTIFICATE OF CORRECTION

PATENT NO. : 5,129,359

DATED : July 14, 1992

INVENTOR(S) : TETSUYA TAKEI ET AL.

It is certified that error appears in the above-identified patent and that said Letters Patent is hereby corrected as shown below:

COLUMN 7

Line 7, "metals e.g." should read --metals, e.g.--.
    Line 17, "cross sectional" should read
        --cross-sectional--.

COLUMN 8

Line 17, "gas" should read --supply means for
        supplying the film-forming raw material gas--.
    Line 52, Close up right margin.
    Line 53, Close up left margin.
    Line 56, "german ($GeH_4$)" should read --germane ($GeH_4$)--.

COLUMN 9

Line 30, "members," should read --members and--.

COLUMN 11

Line 67, "an" should read --a--.

COLUMN 15

Line 4, "cross sec-" should read --cross-sec- --.
    Line 16, "of gas" should read --of said gas--.

UNITED STATES PATENT AND TRADEMARK OFFICE
CERTIFICATE OF CORRECTION

PATENT NO. : 5,129,359
DATED : July 14, 1992
INVENTOR(S) : TETSUYA TAKEI ET AL.

It is certified that error appears in the above-indentified patent and that said Letters Patent is hereby corrected as shown below:

COLUMN 16

Line 8, "longitudinally" should read --longitudinally in the direction of the axes of said cylindrical substrates, said gas supply pipe being provided with a plurality of gas liberation holes capable of radiately supplying a film-forming raw material gas toward said plurality of cylindrical substrates, and said gas supply pipe being electrically connected to a power source so as to apply a bias voltage between said gas supply pipe and said plurality of cylindrical substrates, such that said gas supply pipe is capable of serving as a bias electrode to provide an electric field between said gas supply pipe and said cylindrical substrates.--.

Lines 8-10, "electric field between said substrate and said part of said gas supply pipe situated in said discharge space." should be deleted.

Line 12, "cross" should read --cross- --.

Signed and Sealed this

Twelfth Day of October, 1993

Attest:

Attesting Officer

BRUCE LEHMAN

Commissioner of Patents and Trademarks